US006884683B2

(12) United States Patent
Hshieh et al.

(10) Patent No.: US 6,884,683 B2
(45) Date of Patent: Apr. 26, 2005

(54) TRENCH DMOS TRANSISTOR HAVING A ZENER DIODE FOR PROTECTION FROM ELECTRO-STATIC DISCHARGE

(75) Inventors: Fwu-Iuan Hshieh, Saratoga, CA (US); Koon Chong So, Fremont, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 10/714,807

(22) Filed: Nov. 18, 2003

(65) Prior Publication Data

US 2004/0097042 A1 May 20, 2004

Related U.S. Application Data

(62) Division of application No. 09/862,541, filed on May 22, 2001, now Pat. No. 6,657,256.

(51) Int. Cl.[7] .............................................. H01L 21/336
(52) U.S. Cl. ....................... 438/268; 438/212; 438/237; 438/270; 438/272; 438/589
(58) Field of Search ................................. 438/156, 212, 438/237, 268–272, 589

(56) References Cited

U.S. PATENT DOCUMENTS

| 5,072,266 | A | | 12/1991 | Bulucea et al. ............. 357/23.4 |
| 5,100,829 | A | * | 3/1992 | Fay et al. ...................... 438/54 |
| 5,541,425 | A | | 7/1996 | Nishihara ................... 257/139 |
| 5,602,046 | A | | 2/1997 | Calafut et al. ................ 437/41 |
| 5,866,931 | A | | 2/1999 | Bulucea et al. ............. 257/331 |
| 5,959,345 | A | * | 9/1999 | Fruth et al. .................. 257/605 |
| 6,268,242 | B1 | * | 7/2001 | Williams et al. ............ 438/237 |
| 6,413,822 | B1 | | 7/2002 | Williams et al. ............ 438/270 |
| 6,455,378 | B1 | * | 9/2002 | Inagawa et al. ............. 438/270 |
| 2002/0096710 | A1 | * | 7/2002 | Inagawa et al. ............. 257/330 |
| 2002/0168821 | A1 | * | 11/2002 | Williams et al. ............ 438/268 |

OTHER PUBLICATIONS

Wolf, Ph.D., Stanley, Richard N. Tauber, Ph.D., "Silicon Epitaxial Film Growth," Silicon Processing for the VLSI Era—vol. 1: Process Technology, Lattice Press, 1986, p. 124.*

* cited by examiner

Primary Examiner—Mary Wilczewski
Assistant Examiner—Toniae M. Thomas
(74) Attorney, Agent, or Firm—Mayer Fortkort & Williams, PC; Stuart H. Mayer, Esq.; Karin L. Williams, Esq.

(57) ABSTRACT

A trench DMOS transistor having overvoltage protection includes a substrate of a first conductivity type and a body region of a second conductivity type formed over the substrate. At least one trench extends through the body region and the substrate. An insulating layer lines the trench and overlies the body region. A conductive electrode is deposited in the trench so that it overlies the insulating layer. A source region of the first conductivity type is formed in the body region adjacent to the trench. An undoped polysilicon layer overlies a portion of the insulating layer. A plurality of cathode regions of the first conductivity type are formed in the undoped polysilicon layer. At least one anode region is in contact with adjacent ones of the plurality of cathode regions.

13 Claims, 10 Drawing Sheets

TRENCH DMOS TRANSISTOR HAVING A ZENER DIODE FOR PROTECTION FROM ELECTRO-STATIC DISCHARGE

This application is a division of U.S. patent application Ser. No. 09/862,541, filed May 22, 2001 now U.S. Pat. No. 6,657,256, and entitled "Trench DMOS Transistor Having a Zener Diode For Protection From Electro-Static Discharge."

FIELD OF THE INVENTION

The present invention relates generally to MOSFET transistors and more generally to DMOS transistors having a trench structure.

BACKGROUND OF THE INVENTION

DMOS (Double diffused MOS) transistors are a type of MOSFET (Metal On Semiconductor Field Effect Transistor) that use diffusion to form the transistor regions. DMOS transistors are typically employed as power transistors to provide high voltage circuits for power integrated circuit applications. DMOS transistors provide higher current per unit area when low forward voltage drops are required.

A typical discrete DMOS circuit includes two or more individual DMOS transistor cells which are fabricated in parallel. The individual DMOS transistor cells share a common drain contact (the substrate), while their sources are all shorted together with metal and their gates are shorted together by polysilicon. Thus, even though the discrete DMOS circuit is constructed from a matrix of smaller transistors, it behaves as if it were a single large transistor. For a discrete DMOS circuit it is desirable to maximize the conductivity per unit area when the transistor matrix is turned on by the gate.

One particular type of DMOS transistor is a so-called trench DMOS transistor in which the channel is formed vertically and the gate is formed in a trench extending between the source and drain. The trench, which is lined with a thin oxide layer and filled with polysilicon, allows less constricted current flow and thereby provides lower values of specific on-resistance. Examples of trench DMOS transistors are disclosed in U.S. Pat. Nos. 5,072,266, 5,541, 425, and 5,866,931.

Electrostatic Discharge (ESD) presents a problem for semiconductor devices, particularly for DMOS structures. The high voltage transient signal from a static discharge can bias an object with more than 10,000 Volts. The unique hazard in DMOS devices is the high electric field that can develop across a relatively thin gate dielectric used in the normal course of operation of the device. The gate dielectric, which is often oxide, can rupture under high electric field conditions when the charge built up on the gate penetrates the gate oxide, which normally acts as an insulator. The effects of the permanent damage caused by the rupture may not be immediately apparent; therefore, the possibility of gate oxide rupture constitutes a realistic reliability concern. Because ESD conditions are common in many working environments, many commercial DMOS devices are equipped with self-contained ESD protection systems. These can be discrete or integrated with the main functional circuitry.

One method for protecting the gate of the devices from voltage above the oxide breakdown value employs a zener diode connected between the gate and source of the DMOS. An example of such a method and device is shown in U.S. Pat. No. 5,602,046. This technique improves the ESD rating of the MOSFET gate and helps avoid over-voltage damage.

One problem with the device shown in the previously mentioned patent is that its fabrication requires additional mask steps, increasing its complexity to manufacture and thus the cost of the device.

Accordingly, it would be desirable to provide a trench DMOS transistor having overvoltage protection from ESD which is relatively simple and inexpensive to manufacture.

SUMMARY OF THE INVENTION

The present invention provides a trench DMOS transistor having overvoltage protection. The transistor includes a substrate of a first conductivity type and a body region of a second conductivity type formed over the substrate. At least one trench extends through the body region and the substrate. An insulating layer lines the trench and overlies the body region. A conductive electrode is deposited in the trench so that it overlies the insulating layer. A source region of the first conductivity type is formed in the body region adjacent to the trench. An undoped polysilicon layer overlies a portion of the insulating layer. A plurality of cathode regions of the first conductivity type are formed in the undoped polysilicon layer. At least one anode region is in contact with adjacent ones of the plurality of cathode regions.

In accordance with one aspect of the invention, the undoped polysilicon layer overlies a portion of the insulating layer that is vertically displaced from the body region.

In accordance with another aspect of the invention, the plurality of cathode regions and the anode region are disposed in the portion of the insulating layer vertically displaced from the trench.

In accordance with yet another aspect of the invention, the plurality of cathode regions include boron implanted therein.

In accordance with another aspect of the invention the source region and the plurality of cathode regions are formed in simultaneous deposition steps.

DETAILED DESCRIPTION

Figure 1:
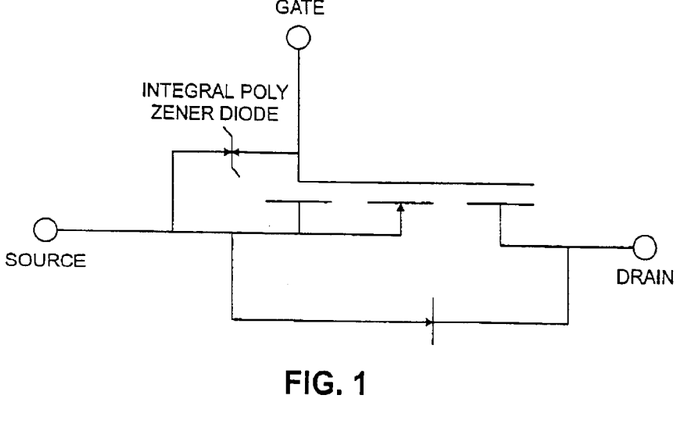
FIG. 1 shows the circuit equivalent for a typical N-channel DMOS in which a zener diode is located between the source and gate of the DMOS.

FIG. 1 shows the circuit equivalent for a typical N-channel DMOS in which a zener diode is located between the source and gate of the DMOS. The zener diode breaks down when the gate to source voltage exceeds a specified voltage value.

Figure 2:
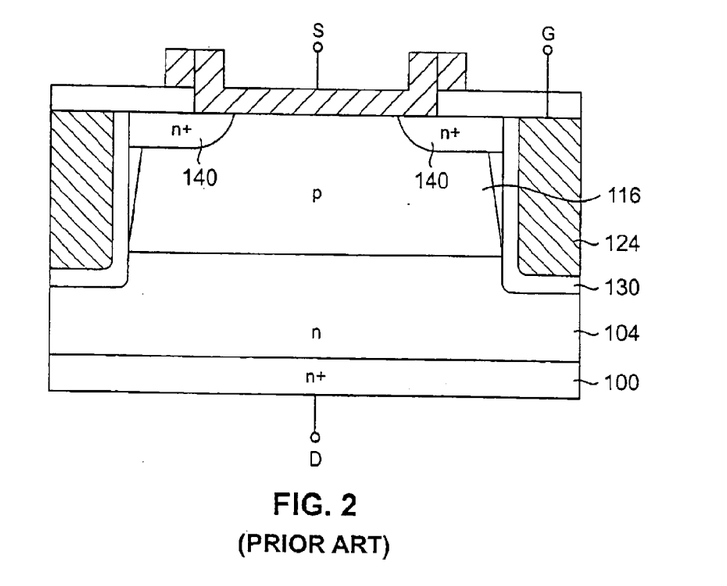
FIG. 2 shows a cross-section of a conventional trench DMOS structure.

FIG. 2 illustrates an example of a conventional trench DMOS structure. The structure includes an n+ substrate 100 on which is grown a lightly n-doped epitaxial layer 104. Within doped epitaxial layer 104, a body region 116 of opposite conductivity is provided. An n-doped epitaxial layer 140 that overlies most of the body region 116 serves as the source. A rectangularly shaped trench 124 is provided in the epitaxial layers, which is open at the upper surface of the structure and defines the perimeter of the transistor cell. A gate oxide layer 130 lines the sidewalls of the trench 124. The trench 124 is filled with polysilicon, i.e., polycrystalline silicon. A drain electrode is connected to the back surface of the semiconductor substrate 100, a source electrode is connected to the two source regions 140 and the body region 116, and a gate electrode is connected to the polysilicon that fills the trench 124.

Figure 11:
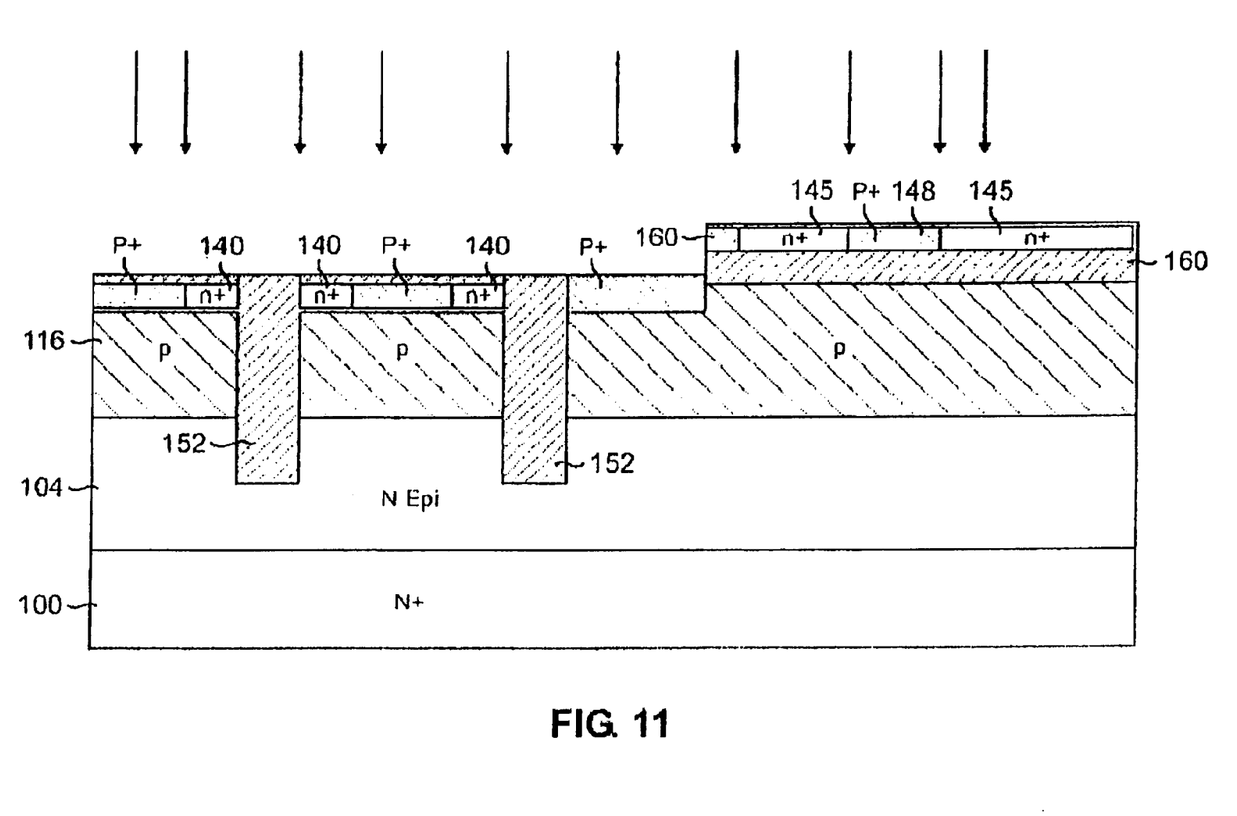

In accordance with the present invention, a zener diode is incorporated into the trench DMOS structure shown in FIG. 2 in such a way that no additional masking steps are required. FIG. 11 shows the resulting device in cross-section. In FIG. 11, the zener diode comprises cathodes 145 and anode 148. As detailed below, the structure shown in FIG. 11 is advantageous because the source regions 140 of the DMOS transistor and n+ cathode regions 145 of the zener diode can be formed in the same mask and implantation steps.

Figure 3:
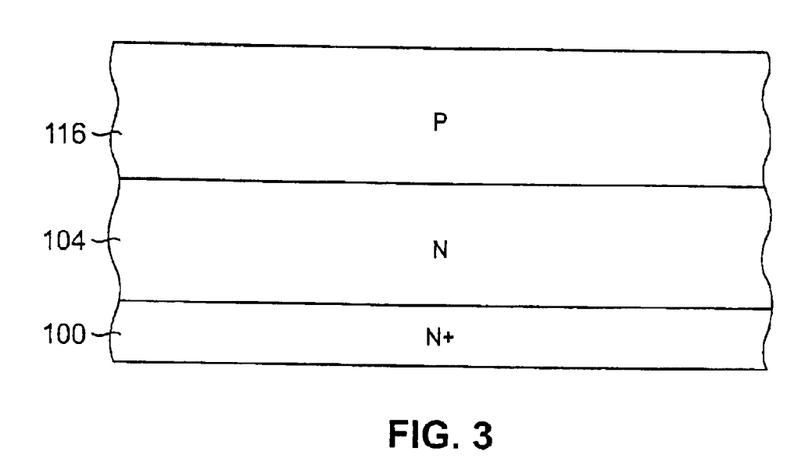
FIGS. 3–12 illustrate a sequence of process steps forming a DMOS transistor having overvoltage protection constructed in accordance with the present invention.

FIGS. 3–12 show a series of exemplary steps that are performed to form the inventive DMOS device. In FIG. 3, an N– doped epitaxial layer 104 is grown on a conventionally N+ doped substrate 100. Epitaxial layer 104 is typically 5.5 microns in thickness for a 30 V device. Next, P-body region 116 is formed in an implantation and diffusion step. Since the P-body implant is uniform across the substrate, no mask is needed. The P-body regions are boron implanted at 40 to 60 KeV with a dosage of about $5.5 \times 10^{13}/cm^3$.

Figure 4:
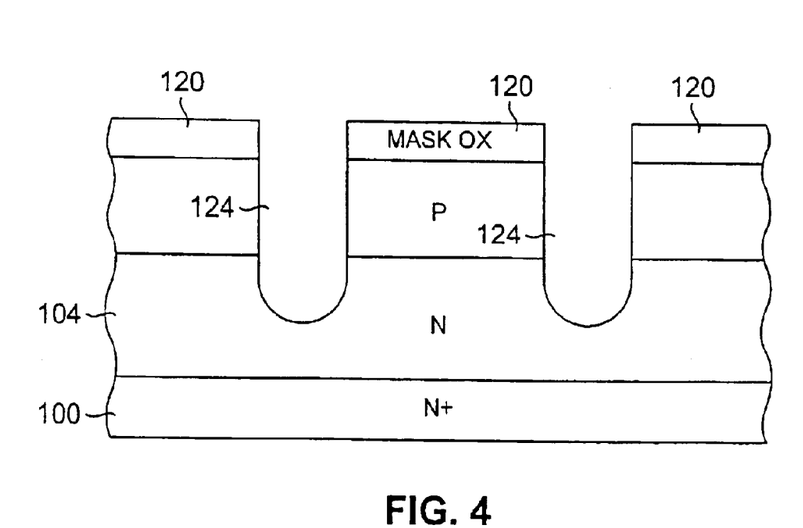

In FIG. 4, a mask layer is formed by covering the surface of epitaxial layer 104 with an oxide layer, which is then conventionally exposed and patterned to leave mask portions 120. Mask portions 120 are used for defining the location of the trenches. The patterned mask portions 120 define the trench sidewalls. Trenches 124 are dry etched through the mask openings by reactive ion etching to a depth that typically ranges from 1.5 to 2.5 microns.

After the trenches are etched, the sidewalls of each trench are smoothed. First, a dry chemical etch may be used to remove a thin layer of oxide (typically about 500–1000 A) from the trench sidewalls to eliminate damage caused by the reactive ion etching process. Next, a sacrificial silicon dioxide layer (not shown) is grown over trenches 124 and mask portions 120. The sacrificial layer, as well as mask portions 120, are removed either by a buffer oxide etch or an HF etch so that the resulting trench sidewalls are as smooth as possible.

Figure 5:
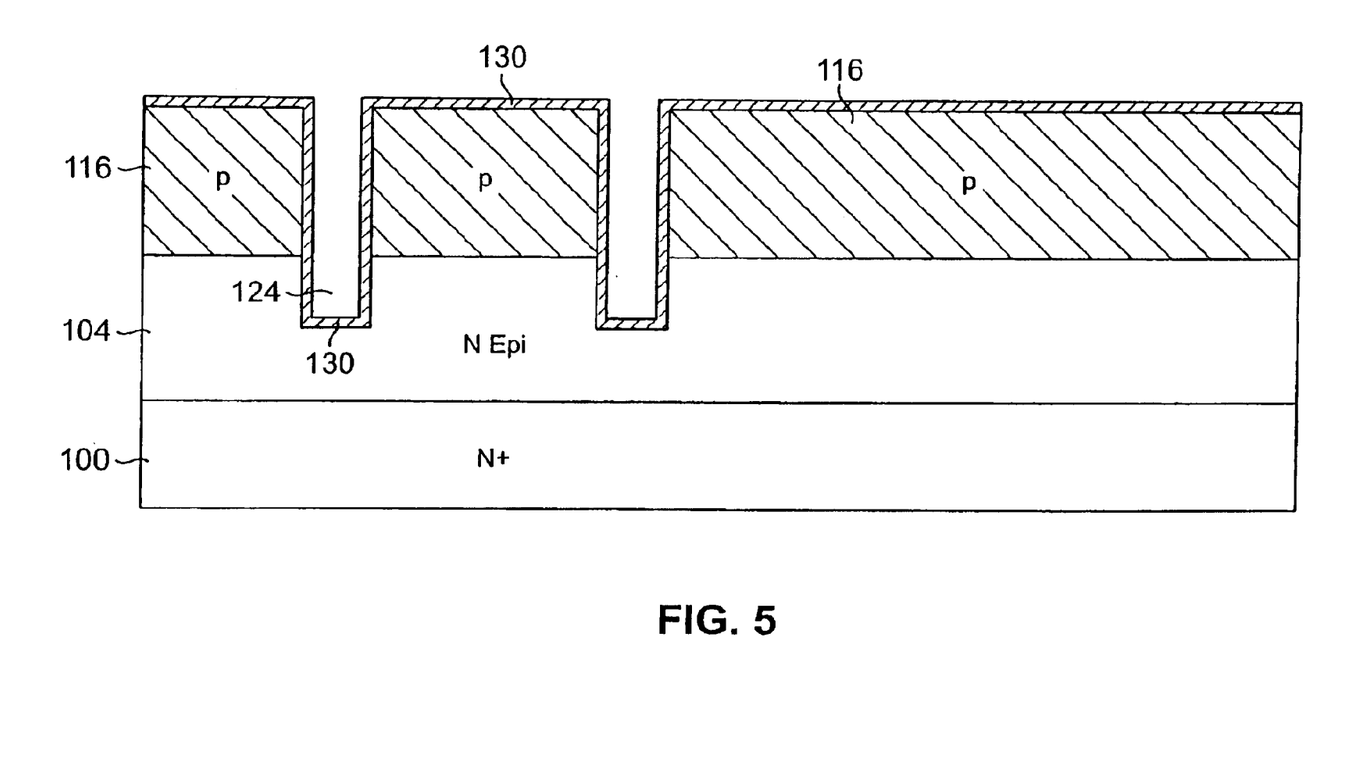
Figure 6:
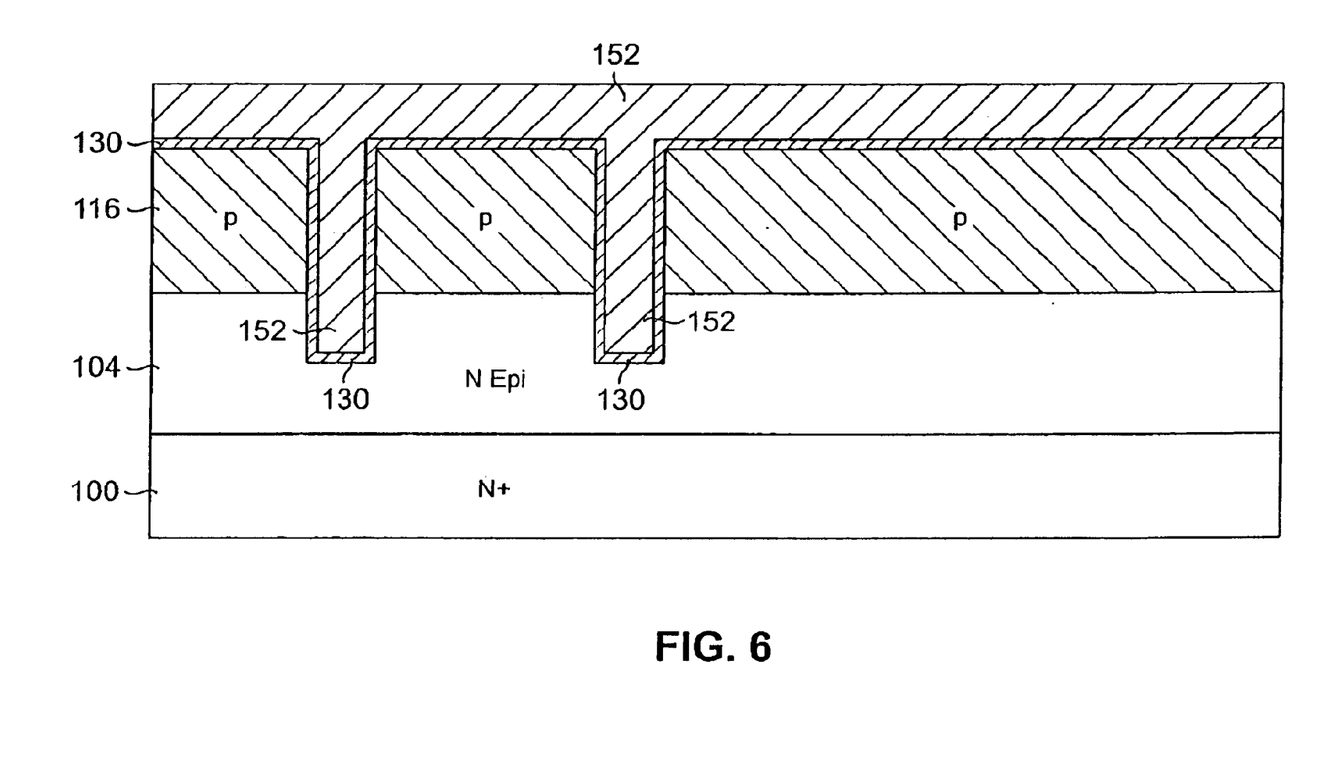

As shown in FIG. 5, the gate oxide layer 130 is then deposited on the entire structure so that it covers the trench walls and the surface of p-body 116. Gate oxide layer 130 typically has a thickness in the range of 500–800 angstroms. Next, in FIG. 6, the trenches 124 are filled with polysilicon 152, i.e., polycrystalline silicon. Prior to deposition, the polysilicon is typically doped with phosphorous chloride or implanted with arsenic or phosphorous to reduce its resistivity, typically within the range of 20 Ω/m. In some embodiments of the invention the polysilicon may be deposited in a two-step process. In the first step, a layer of undoped polysilicon is deposited to line the sidewalls of the trenches. The undoped polysilicon layer is followed by the deposition of a layer of doped polysilicon. Typically, the thickness of the doped polysilicon layer is greater than the thickness of the undoped polysilicon layer. For example, the ratio of the thickness of the doped polysilicon layer to the undoped polysilicon layer may be 7:1, with a total thickness of about 8,000 A. The undoped polysilicon layer is advantageously employed as a buffer layer inhibits the penetration of dopant material through the gate oxide layer and into the p-body, thus further reducing punch-through.

Figure 7:
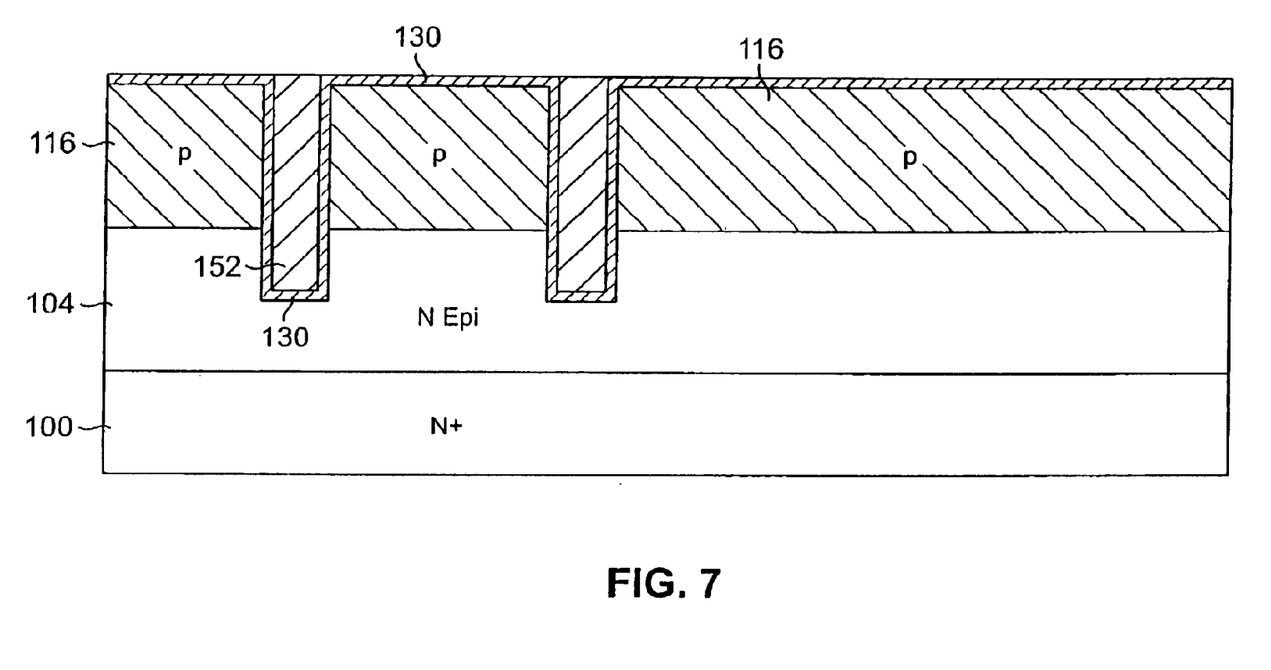
Figure 8:
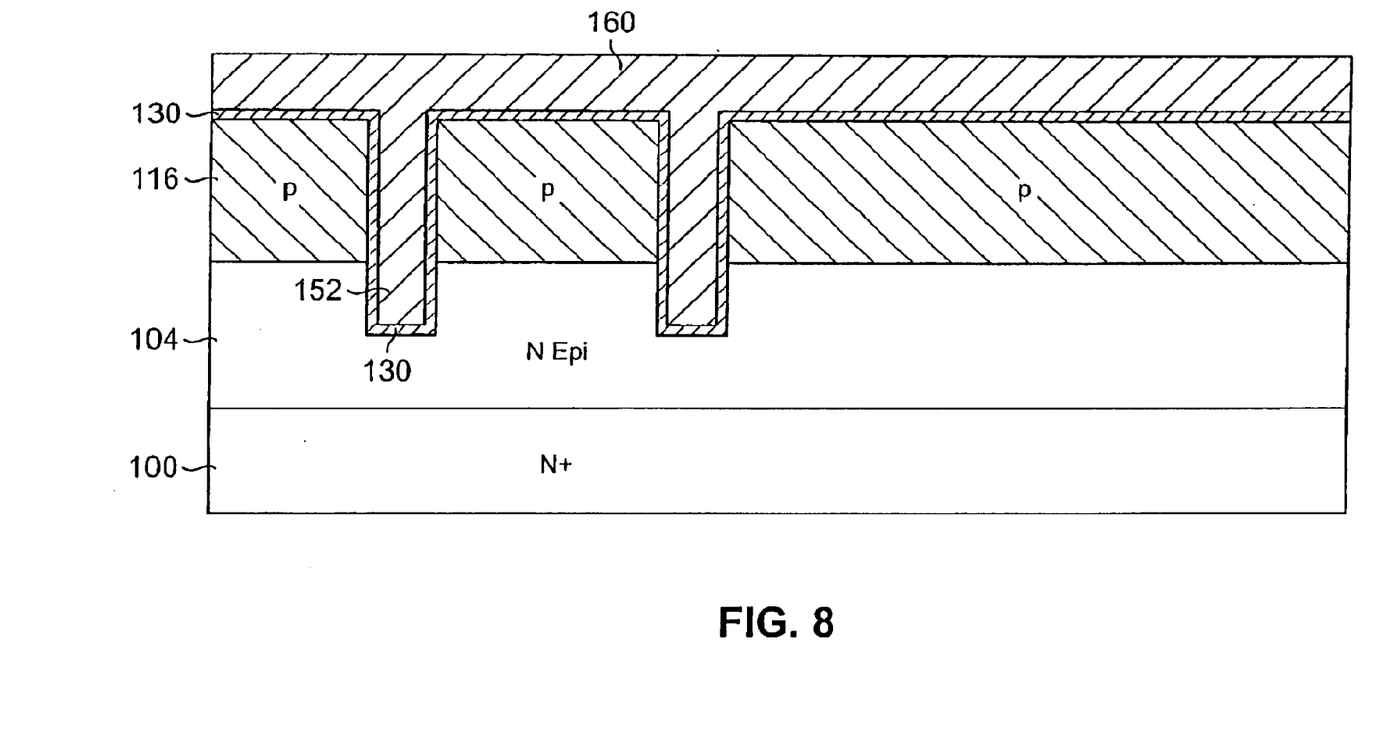

In FIG. 7, the polysilicon layer 152 is etched to optimize its thickness and to expose the portion of the gate oxide layer 130 that extends over the surface of p-body 116. In FIG. 8, an undoped polysilicon layer 160 is deposited over the gate oxide layer 130 and the exposed surface of doped polysilicon layer 152. Undoped polysilicon layer 160, which defines the layer in which the zener diode will be formed, typically has a thickness in the range of 5,000 to 10,000 angstroms.

Figure 9:
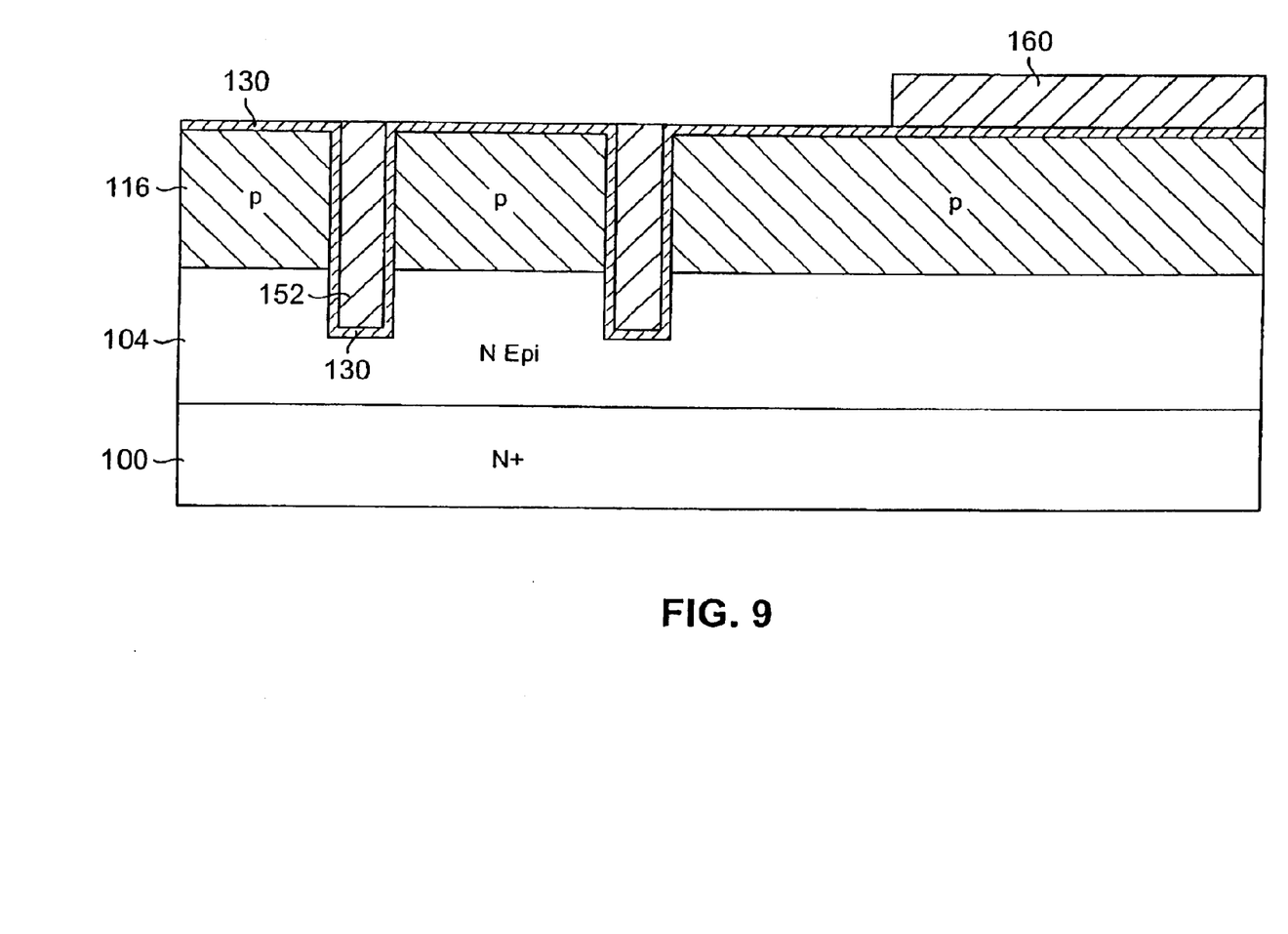

In FIG. 9, undoped polysilicon layer 160 is etched back so that it is completely removed from the region in which the DMOS transistor is defined. That is, undoped polysilicon layer 160 is removed so that is does not overlie the trench and body regions of the DMOS. Accordingly, the undoped polysilicon layer 160 only remains in the region in which the zener diode will be formed.

Figure 10:
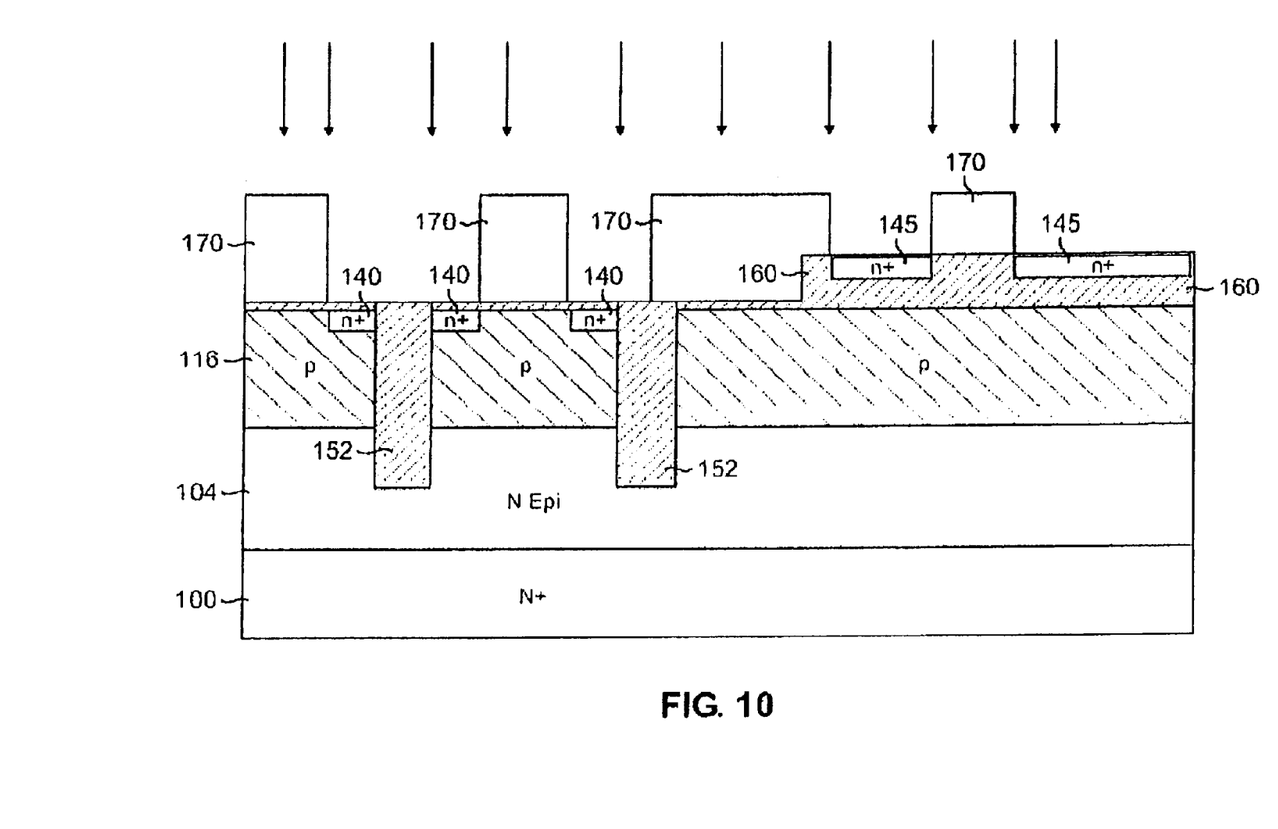

Next, in FIG. 10, a photoresist masking process is used to form patterned masking layer 170. Patterned masking layer 170 defines source regions 140 of the DMOS transistor and n+ cathode regions 145 of the zener diode. Source and cathode regions 140 and 145 are then formed by an implantation and diffusion process. For example, the source regions may be implanted with arsenic at 80 KeV to a concentration that is typically in the range of $8 \times 10^{15}$ to $1.2 \times 10^{16}$. After implantation, the arsenic is diffused to a depth of approximately 0.5 microns. In FIG. 11, masking layer 170 is removed in a conventional manner and neutral boron is implanted into the cathode regions 145 and anode region 148 to achieve the desired breakdown voltage of the zener diode.

Figure 12:
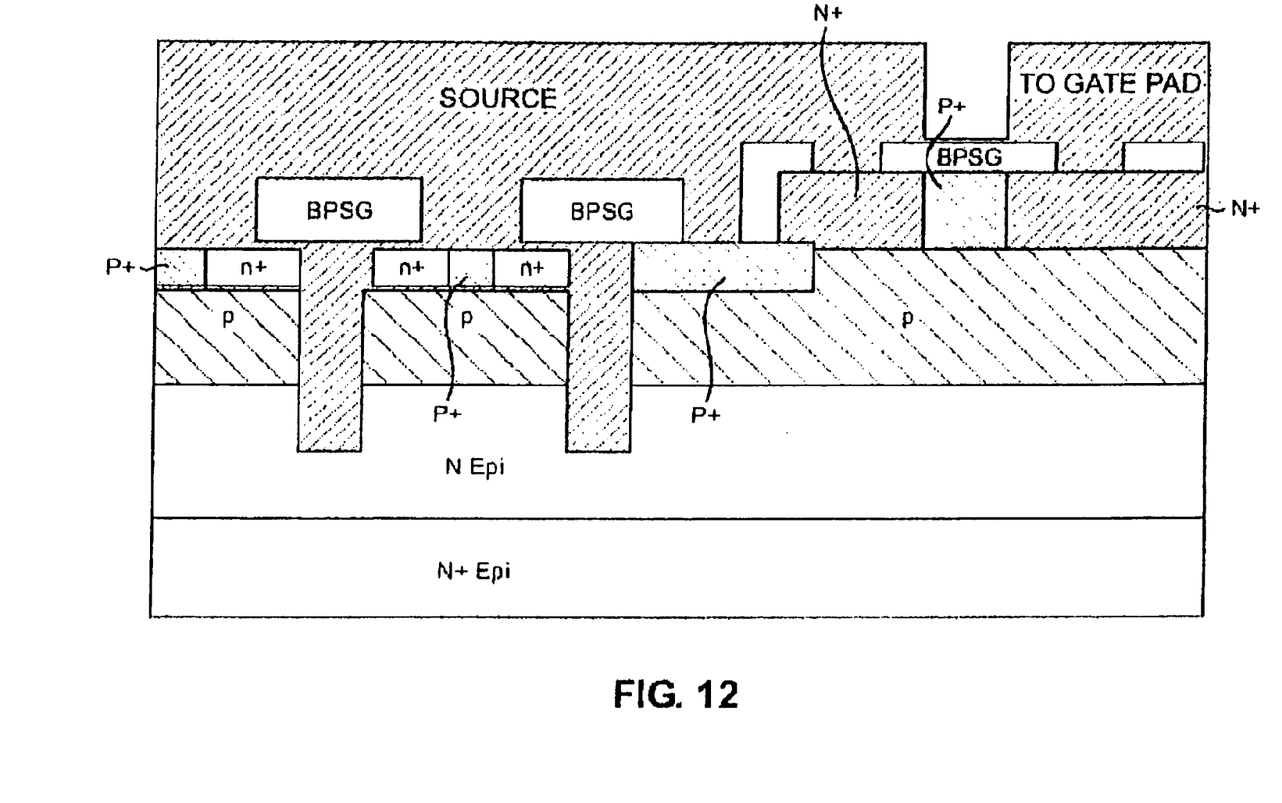

In FIG. 12, the trench DMOS transistor is completed in a conventional manner by forming and patterning a BPSG layer over the structure to define BPSG regions associated with the source and gate electrodes. Also, a drain contact layer is formed on the bottom surface of the substrate. Finally, a pad mask is used to define pad contacts.

Although various embodiments are specifically illustrated and described herein, it will be appreciated that modifications and variations of the present invention are covered by the above teachings and are within the purview of the appended claims without departing from the spirit and intended scope of the invention. For example, the method of the present invention may be used to form a trench DMOS and zener diode in which the conductivities of the various semiconductor regions are reversed from those described herein.

What is claimed is:

1. A method of making a trench DMOS transistor having overvoltage protection, said method comprising the steps of comprising:

providing a substrate of a first conductivity type;

forming a body region by an implantation of a second conductivity type on the substrate;

forming at least one trench extending through the body region, wherein said body region is formed prior to the step of forming at least one trench;

depositing an insulating layer that lines the trench and overlies said body region;

depositing a conductive electrode in the trench overlying the insulating layer;

implanting a dopant of the first conductivity type to form a source region in the body region adjacent to the trench;

depositing an undoped polysilicon layer overlying a portion of the insulating layer; and implanting a dopant of the first conductivity type to form a plurality of cathode regions in the undoped polysilicon layer, said plurality of cathode regions being separated by at least one anode region.

2. The method of claim 1 wherein the implanting steps forming a source region and a plurality of cathode regions are performed simultaneously.

3. The method of claim 1 further comprising the step of defining a photolithographic mask over the body region and the undoped polysilicon layer.

4. The method of claim 1 wherein the step of depositing an undoped polysilicon layer is performed before the implanting step.

5. The method of claim 1 further comprising the step of etching the conductive electrode to expose a portion of the insulating layer overlying the body region.

6. The method or claim 1 further comprising the step of etching away a portion of the undoped polysilicon layer overlying the body region and said at least one trench.

7. The method of claim 1 wherein said insulating layer is an oxide layer.

8. The method of claim 1 wherein said conductive electrode is polysilicon.

9. The method of claim 1 further comprising the step of forming a drain electrode on a bottom surface of the substrate.

10. The method of claim 9 further comprising the step of forming a source electrode coupled to the source region.

11. The method of claim 7 wherein said oxide layer has a thickness between about 500 and 800 angstroms.

12. The method of claim 11 wherein said conductive electrode comprises a second layer of undoped polysilicon and a layer of doped polysilicon disposed over said second undoped polysilicon layer.

13. The method of claim 1 wherein further comprising the step of implanting boron into at least said plurality of cathode regions and said anode to achieve a prescribed diode breakdown voltage.

* * * * *